United States Patent [19]

Jones

[11] 4,353,601
[45] Oct. 12, 1982

[54] VEHICLE SKID CONTROL

[75] Inventor: James J. Jones, Plano, Tex.

[73] Assignee: Texas Instruments Incorporated, Dallas, Tex.

[21] Appl. No.: 25,131

[22] Filed: Apr. 2, 1970

Related U.S. Application Data

[63] Continuation-in-part of Ser. No. 837,418, Jun. 30, 1969, Pat. No. 3,617,760, Ser. No. 837,433, Jun. 30, 1969, Pat. No. 3,611,109, Ser. No. 837,497, Jun. 30, 1969, abandoned, and Ser. No. 837,855, Jun. 30, 1969, abandoned.

[51] Int. Cl.³ ............................ B60T 8/02; B60T 8/08
[52] U.S. Cl. .................................................. 303/106
[58] Field of Search .................. 188/181; 303/20, 21, 303/106; 307/121; 324/162; 328/147; 340/262

[56] References Cited

U.S. PATENT DOCUMENTS

| | | | |
|---|---|---|---|
| 3,494,671 | 2/1970 | Slavin et al. | 303/21 P |
| 3,499,689 | 3/1970 | Carp et al. | 303/21 P |
| 3,524,685 | 8/1970 | Harned et al. | 303/21 BE |
| 3,525,553 | 8/1970 | Carp et al. | 303/21 P |
| 3,544,172 | 12/1970 | Howard et al. | 303/21 P |
| 3,578,819 | 5/1971 | Atkins | 303/21 P |

FOREIGN PATENT DOCUMENTS 909255 10/1962 United Kingdom ........... 303/21 BE

*Primary Examiner*—Charles E. Frankfort
*Attorney, Agent, or Firm*—William E. Hiller; Melvin Sharp; James T. Comfort

[57] ABSTRACT

A vehicle skid control braking system of the type that generates brake control signals varying in accordance with braking conditions, such as vehicle speed, wheel speed and road surface conditions. The system includes: (1) frequency converter apparatus that have pulse generating apparatus responsive to variable frequency wheel speed signals for producing a D.C. signal having a magnitude related to and varying with the frequency of the wheel speed signals; (2) wheel speed rate detector apparatus responsive to the D.C. signal for producing a first brake inhibit signal; (3) ramp generator apparatus responsive to the wheel speed signals for generating a vehicle velocity ramp signal proportional to vehicle speed; (4) pulse width detector apparatus responsive to the brake control signals for producing retarding force signals during the period that such brake control signals vary from a brake inhibit value to a normal brake value; (5) an automatically adjustable switching circuit apparatus or variable speed switching apparatus responsive to the brake control signals, the retarding force signals and the vehicle velocity ramp signals for producing a second brake inhibit signal; and (6) brake controller apparatus responsive to the first and second brake inhibit signals for generating the brake control signals.

65 Claims, 7 Drawing Figures

VEHICLE SKID CONTROL

This application is a continuation-in-part of U.S. applications Ser. No. 837,418 filed June 30, 1969, now U.S. Pat. No. 3,617,760 issued Nov. 2, 1971; Ser. No. 837,433 filed June 30, 1969, now U.S. Pat. No. 3,611,109 issued Oct. 5, 1971; Ser. No. 837,497 filed June 30, 1969, abandoned in favor of continuation application Ser. No. 229,334 filed Feb. 25, 1972, now U.S. Pat. No. 4,209,202 issued June 24, 1980; Ser. No. 837,855 filed June 30, 1969, abandoned in favor of continuation application Ser. No. 229,345 filed Feb. 25, 1972, now U.S. Pat. No. 4,212,499 issued July 15, 1980.

BRIEF DESCRIPTION OF INVENTION AND BACKGROUND INFORMATION

This invention relates to a vehicle skid control system and, more particularly, to a "pumping-type" or "pulse action" vehicle brake control system that advantageously utilizes a novel frequency converter, a novel ramp generator, a novel pulse-width detector, and a novel automatically adjustable switching circuit.

When braking an automobile under emergency stopping conditions or under adverse road conditions, the possibility exists that the vehicle will go into an uncontrollable skid or a controllable skid which prevents the driver from bringing his vehicle to a safe stop within the distance available. In either case, one factor that indicates an imminent skid is the deceleration rate of the rear wheels. Some improvement in vehicle stability can be achieved by automatically "pumping" or pulsing the brakes at the rear wheels in an arbitrary pre-programmed way.

Recently, a system has been developed that operates on the principle of inhibiting the normal braking action initiated by the automobile operator. In this system, wheel speed sensors generate signals that are proportional to wheel speed. The wheel speed signals are processed through a control module which generates a voltage to energize a solenoid in an actuator that controls the hydraulic braking system to the rear wheels. When a skid is imminent, a command signal from the control module causes the actuator solenoid to close a vacuum passage in a diaphragm chamber. By action of the diaphragm and the normal hydraulic pressure from the master cylinder as developed by the automobile operator, the hydraulic pressure to the rear wheels is released, thereby inhibiting the rear wheel braking action. When the rear wheels spin-up to the vehicle speed, the control module produces a signal to de-energize the actuator solenoid. This restores line pressure and reapplies the rear brakes. In effect, this system "pumps" the rear brakes in a manner often recommended for controlled stopping under adverse driving conditions.

The control module includes a frequency converter for each wheel speed sensor to convert a frequency varying signal into a direct current signal. A summation in a summing amplifier of the frequency converter outputs produces a composite of the wheel speed signals. A deceleration rate detector and an acceleration rate detector respond to the output of the summing amplifier to produce outputs proportional to the rate of deceleration and the rate of acceleration, respectively, of the rear wheels of a motor vehicle. A signal proportional to the output of the summing amplifier is transferred to a vehicle velocity ramp generator and one input of an automatically adjustable switching circuit. The velocity ramp generator produces a step ramp function having an overall slope related to the actual speed of the automobile when braking to a stop. In addition to a signal related to wheel speed, the switching circuit also has an input from the vehicle velocity ramp generator and an input from a retarding force detector. An output is produced at the switching circuit whenever the summation of a wheel speed signal, a velocity ramp signal, and a retarding force signal reaches a threshold condition. The retarding force detector produces an output signal which relates to the braking factors including tire condition, brake condition, and the condition of the road surface. To generate a control signal to the actuator solenoid, the output of the deceleration rate detector, the acceleration rate detector, and the switching circuit must have a certain designated relationship. These three signals are the inputs to a brake controller as the last component in the control module.

An object of the present invention is to provide a control module for processing wheel speed signals in a vehicle skid control braking system.

Another object of this invention is to provide a control module for producing a pumping type braking action in a skid control vehicle braking system.

A further object of this invention is to provide a control module for generating brake inhibit signals in a vehicle skid control braking system.

Still another object of this invention is to provide a control module for generating brake inhibit signals at decreasing vehicle speed in a vehicle skid control braking system.

Still another object of this invention is to provide a control module for processing wheel speed signals in a vehicle skid control braking system that advantageously utilizes a frequency converter, a ramp generator, a pulse-width detector and an automatically adjustable switching circuit.

In accordance with the present invention, a wheel sensor, which may be coupled to the rear wheels of an automobile or to the drive shaft of an automobile, generates signals having a frequency varying in accordance with wheel speed. These frequency varying signals are connected to inputs of frequency converters that produce a D.C. output voltage having a magnitude that varies in accordance with the frequency of the wheel sensor signals. The outputs of the frequency converters are averaged and coupled to the input terminals of a deceleration rate detector and an acceleration rate detector. The deceleration rate detector responds to the averaged signal and generates a control signal output at a brake inhibit level when the rate of deceleration of the rear wheels exceeds a preset limit. The acceleration rate detector also responds to the averaged signal varying in accordance with wheel speed to generate an output at a brake inhibit level whenever the rate of rear wheel acceleration does not exceed a preset limit. An automatically adjustable switching circuit also responds to the wheel speed voltage to clamp the acceleration rate detector output at a normal braking level until the wheel speed drops below a value varying in accordance with vehicle speed and braking conditions. The output of the deceleration rate detector, the acceleration rate detector, and switching circuit are combined to form the inputs to a brake controller that energizes an actuator solenoid whenever the outputs of both rate detectors are at a brake inhibit level. A comprehesive embodiment of this invention includes a frequency converter, a ramp generator, a pulse width detector, and an automatically adjustable switching circuit. The frequency converter receives signals from the sensor which has a frequency proportional to wheel speed. This frequency changing signal is amplified in a first amplification stage and connected to a second amplification stage for producing a square wave output. The square wave output produced by the second amplification stage is transferred to an inverter amplifier which produces a second square wave having a 180° phase shift from the first square wave. The leading edge of the two square waves are individually differentiated and the differentiated pulses connected to an integrator. After processing by the integrator, the resulting signals are combined to produce a wave having an average value related to wheel speed. The ramp generator produces an output current that varies inversely with vehicle speed. A voltage proportional to vehicle wheel speed charges an information storage circuit during normal running operation. In a braking mode, the information storage circuit is discharged at a controlled rate so long as normal braking action takes place. When a brake controller inhibits the normal braking operation, the charge in the information storage circuit is held at a fixed level. The controlled discharge begins again from the previous fixed level when the normal braking operation is resumed. The composite discharge of the information storage circuit is along a ramp that varies with vehicle speed. The pulse width detector generates a current waveform that varies with braking factors including road surface condition. A brake controller provides a variable width square wave pulse train to the input of the pulse width detector that includes a source of constant current to charge an information storing circuit. Charging of the information storing circuit takes place only when the brake controller inhibits the normal braking function. At the beginning of the inhibit cycle, a reset circuit discharges the information storage circuit in response to a reset pulse produced by differentiating the leading edge of the input pulses generated at the brake controller. A current amplifier connected to the information storage circuit produces a current signal to the speed inhibit switch that varies in accordance with pulse width of the brake controller. The automatically adjustable switching circuit controls the output of the acceleration rate detector. A signal proportional to vehicle wheel speed, a signal varying in accordance with braking control factors, such as road surface characteristics, and a ramp current inversely related to vehicle speed are connected to inputs of the switching circuit. When the sum of these three signals reaches a threshold condition, the switching circuit operates to release the output of the acceleration rate detector that is then applied as one input to a brake controller. Since both the braking control factor signal and the ramp current are variable signals, each time the switching circuit operates, it releases the acceleration rate detector at a different wheel speed in the operation of a skid control system.

A more complete understanding of the invention and its advantages will be apparent from the specification and claims and form the accompanying drawings illustrative of the invention.

DETAILED DESCRIPTION

Figure 1:
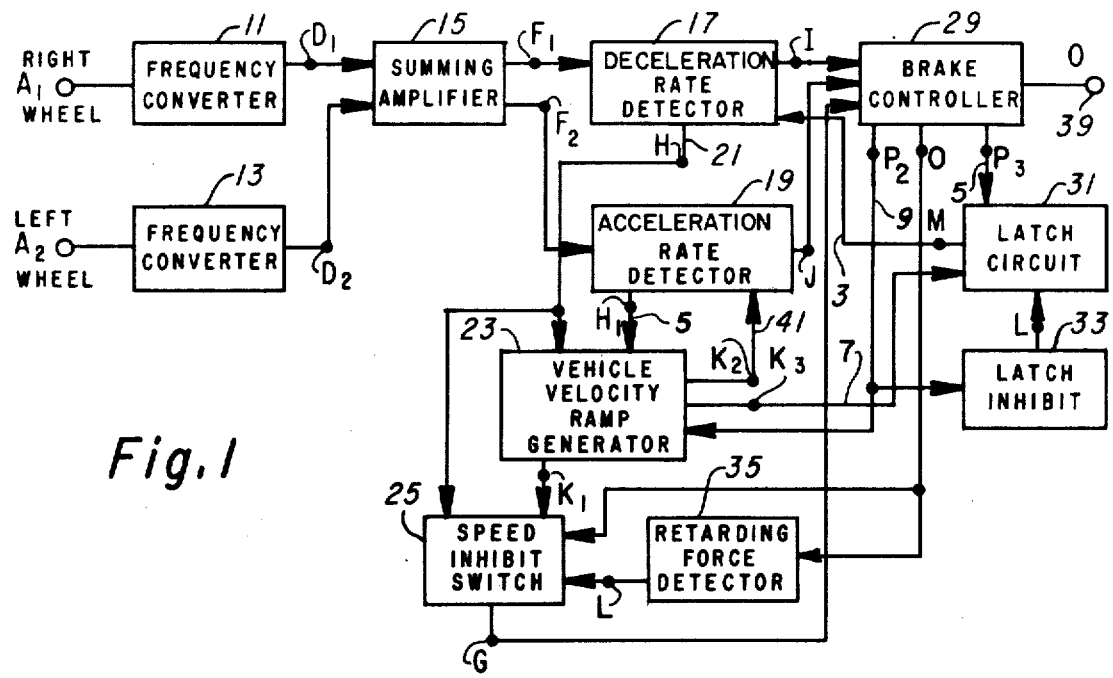
FIG. 1 is a block diagram of one embodiment of a control module for a vehicle skid control braking system.

A detailed description of preferred embodiments of this invention follows with reference being made to the drawings wherein like parts and elements have been given like reference numerals for clarity and understanding of the novel, useful and unobvious features of this invention.

Referring to the drawings, in FIG. 1 there is illustrated in block diagram format the components of one embodiment of a control module in a skid control vehicle braking system including frequency converter 11 and 13. The frequency converter 11 connects to a wheel sensor (not shown) at the right rear wheel of a motor vehicle. The wheel sensor 11 generates a signal (see FIG. 3A$_1$) having frequency variations proportional to wheel speed. The faster the wheel speed, the higher the frequency of the signal connected to the frequency converter 11. Similarly, the frequency converter 13 responds to a frequency dependent signal from a wheel sensor (not shown) at the left rear wheel of a motor vehicle. The output of the converter 11 and 13 is a D.C. voltage having a magnitude related to the right rear wheel speed and the left rear wheel speed, respectively (see FIG. 3D$_1$).

Figure 3:
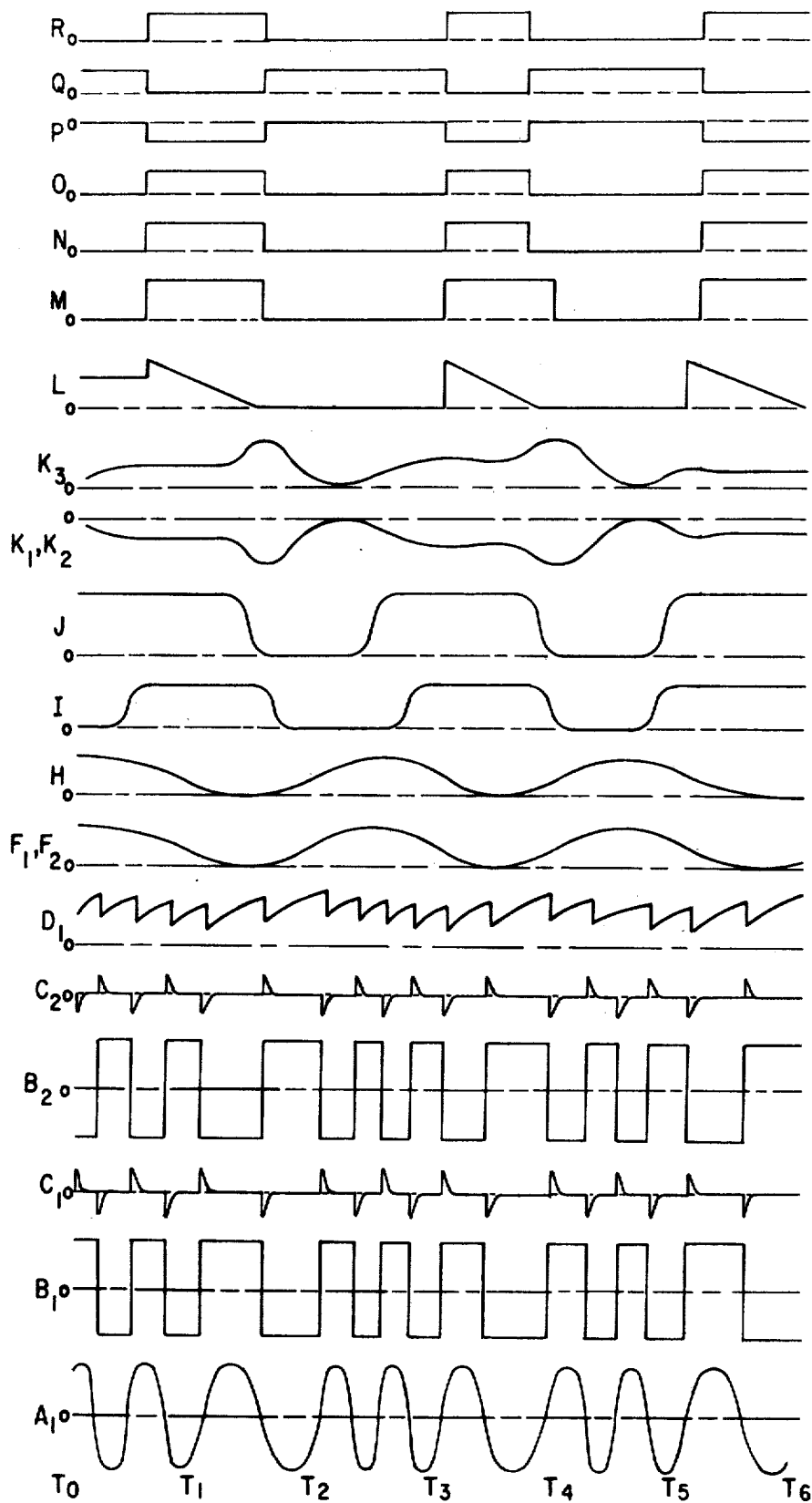
FIG. 3 graphically represents exemplary waveforms that are generated by various components in the block diagrams of FIGS. 1 and 2.

These two speed dependent voltages are connected to inputs of a summing amplifier 15 which has two output signals both proportional to the sum of the output voltages of the frequency converter 11 and 13 (see FIG. 3F$_1$F$_2$). One of the output signals (F$_1$) from the summing amplifier 15 connects to a deceleration rate detector 17 and the second output signal (F$_2$) connects to an acceleration rate detector 19. Both the deceleration rate detector 17 and the acceleration rate detector 19 may include a drive input section (not shown). The output of the deceleration rate detector 17 (see FIG. 3H) appears on line 21, and connects to inputs of a vehicle velocity ramp generator 23 and an automatically adjustable switching circuit or speed inhibit switch 25. Another input to the vehicle velocity ramp generator 23 is a signal (see FIG. 3K$_1$) related to the output of a brake controller 29 on a line 9. A clamping circuit in the acceleration rate detector 19 also connects to the vehicle velocity ramp generator 23.

Additional inputs to the speed inhibit switch 25, other than the voltage proportional to wheel speed on line 21, include a ramp current (see FIG. 3K$_1$) from the vehicle velocity ramp generator 23, the signal (see FIG. 3O) on the line 9 from the brake controller 29, and a retarding force current (see FIG. 3L) from a retarding force detector 35. An output terminal G of the speed inhibit switch 25 connectes to one input of the brake controller 29. An output signal (see FIG. 3J) from the acceleration rate detector 19 is partially controlled by the speed inhibit switch 25. A second input to the controller 29 is the output (see FIG. 3I) of the deceleration rate detector 17.

In the operation of the control module of FIG. 1, the frequency varying signals generated at the right rear wheel sensor and the left rear wheel sensor are converted in the frequency converter 11 and 13, respectively, into D.C. voltages that are combined in the summing amplifier 15 to produce inputs to a deceleration rate detector 17 and an acceleration rate detector 19. The deceleration rate detector 17 generates a signal as one input to the brake controller 29 whenever the deceleration rate of the rear wheels exceeds a set limit. The acceleration rate detector 19 generates a signal as one input to the brake controller 29 whenever the speed inhibit switch 25 does not inhibit the normal operation of the acceleration rate detector 19. To produce a brake inhibit control signal on an output terminal 39, which is connected to a solenoid (not shown) on a brake actuator, both the rate detectors 17 and 19 must generate a control signal at the inputs to the brake controller 29. The speed inhibit switch 25 will release the output of the acceleration rate detector 19 whenever the three input signals thereto satisfy preset conditions, and the switch itself is not inhibited from operating.

In a typical skid control operation, the automobile operator applies pressure to the brake pedal which actuates the hydraulic brake system in the usual manner. When the deceleration rate detector 17 senses that the decrease in rear wheel speed indicates that a skid is imminent, it produce a control signal as one input to the brake controller 29. At the same time, the acceleration rate detector 19 permits the brake controller 29 to be triggered into a brake inhibit mode if the speed inhibit switch 25 has released the output of the detector 19. Whenever a control pulse from the deceleration rate detector 17 is present and the speed inhibit switch 25 releases the output of the acceleration rate detector 19, an output pulse is generated at the output terminal 39 to energize a solenoid at a brake actuator. Energizing this solenoid, as explained previously, interrupts the normal hydraulic pressure applied to the rear wheels thereby inhibiting braking action.

Before the speed inhibit switch 25 will release the output of the acceleration rate detector 19, the sum of an input current related to the rear wheel speed, an input current from the vehicle velocity ramp generator 23, and an input current from the retarding force detector 35 must reach a threshold level.

During the time interval of the brake inhibit signal at the terminal 39, hydraulic pressure is released from at least the rear wheels, which will then begin to spin up to the speed of the vehicle. This spin-up of the rear wheels is sensed by the deceleration rate detector 17 and the acceleration rate detector 19 to cause the brake controller 29 to produce an output signal that deenergizes the actuator solenoid, thereby reapplying pressure to the rear wheel brake cylinders.

Also provided is a latch circuit 31 which controls the "on time" of the deceleration rate detector 17 by varying its characteristics with respect to vehicle speed and the rate of acceleration of the vehicle wheels. A latch inhibit circuit 33 is provided which prevents the latch circuit 31 from controlling the deceleration rate detector 17 until the actuator solenoid is energized. A signal generated by the brake controller 29 and coupled to the latch inhibit circuit 33 via line 9 operates the latch inhibit circuit 33, which in turn releases the latch circuit 31 and allows it to control the "on time" of the deceleration rate detector 17. Latch circuit 31 receives input signals from the vehicle velocity ramp generator 23 via line 7 and from the brake controller 29 via line 5 and is coupled to control the deceleration rate detector 17 via line 3. On low-mu surfaces at low vehicle speeds, the latch circuit 31 extends the brake inhibit time or "on time" of the deceleration rate detector 17. Applying hydraulic pressure to the rear wheel cylinders will slow the speed of the rear wheels which will again produce conditions to actuate the brake controller 29, thereby initiating a second inhibit cycle. This operation continues with the rear wheel speed decreasing and increasing until the vehicle has been brought to a controlled stop. In effect, the control module "pumps" the rear brakes in a manner often recommended for controlled vehicle stopping.

Detailed examples of a satisfactory frequency converter, vehicle velocity ramp generator, pulse width or retarding force detector, and an automatically adjustable switching circuit or speed inhibit switch are respectively disclosed in the below listed co-pending patent applications:

Ser. No. 837,433 filed June 30, 1969, now U.S. Pat. No. 3,611,109 issued Oct. 5, 1971;

Ser. No. 837,855 filed June 30, 1969, abandoned in favor of continuation application Ser. No. 229,345 filed Feb. 25, 1972, now U.S. Pat. No. 4,212,499 issued July 15, 1980;

Ser. No. 837,418 filed June 30, 1969, now U.S. Pat. No. 3,617,760 issued Nov. 2, 1971; and Ser. No. 837,497 filed June 30, 1969, abandoned in favor of continuation application Ser. No. 229,334 filed Feb. 25, 1972, now U.S. Pat. No. 4,209,202 issued June 24, 1980.

Figure 2:
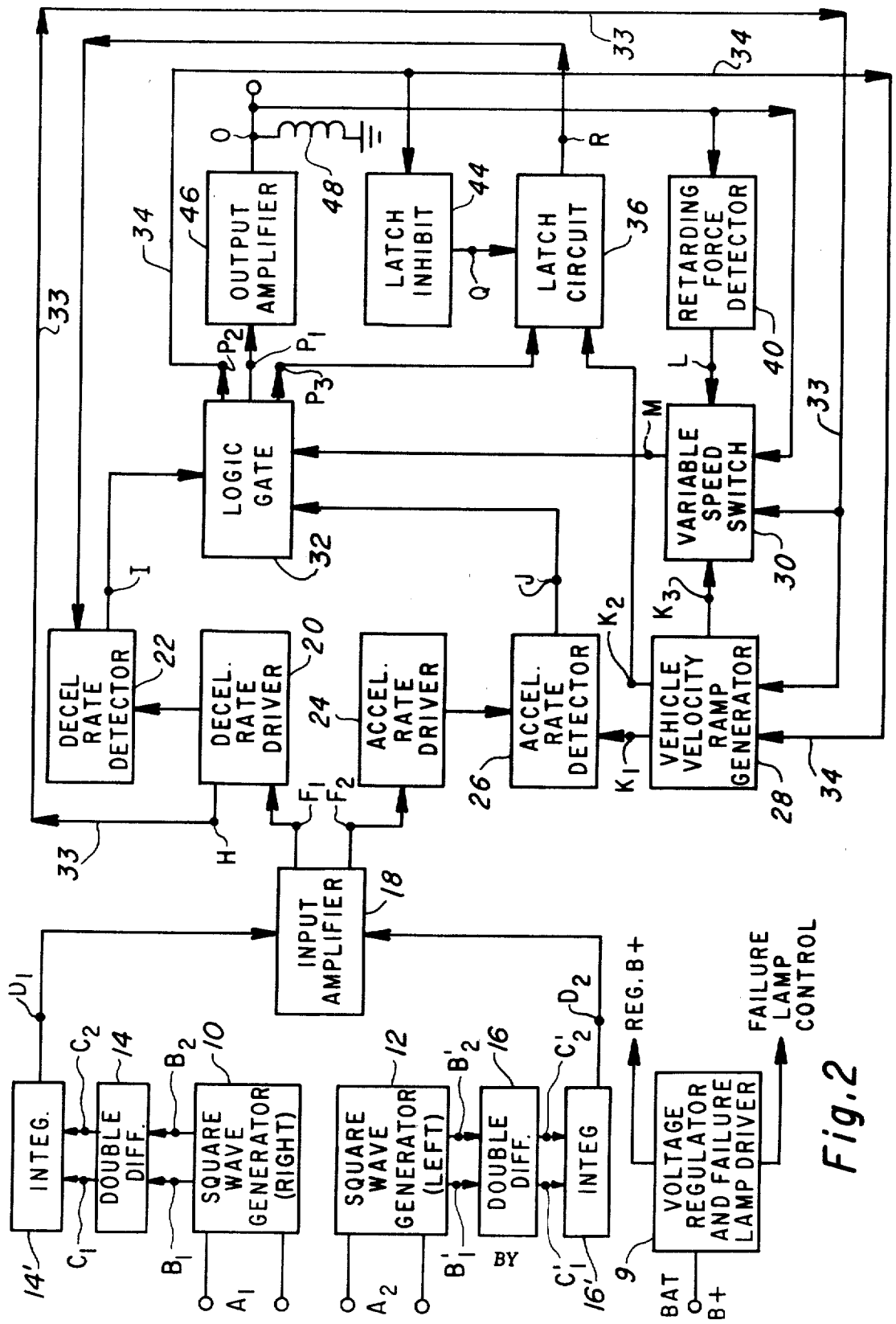
FIG. 2 is a block diagram of another embodiment of a control module for a vehicle skid control braking system.

Referring now to FIG. 2, there is illustrated in block diagram format the components of another embodiment of a control module in a vehicle skid control braking system including square wave generators 10 and 12. The square wave generator 10 responds to a wheel sensor (not shown) at the right rear wheel of a motor vehicle. The wheel sensor generates a signal having a frequency variation proportional to wheel speed as illustrated in FIG. $3A_1$. Higher frequencies ($T_0$-$T_1$) correspond to faster wheel speeds, and low frequencies ($T_1$-$T_2$) correspond to slow wheel speeds. Similarly, the square wave generator 12 responds to a frequency varying signal from a wheel sensor (not shown) at the left rear wheel of a motor vehicle. The square wave generators 10 and 12 amplify, clip and invert the frequency varying signals from their respective wheel sensors. Output signals from the generators 10 and 12 consist of a pair of pulse trains; one having a 180° phase displacement from the other, as illustrated in FIGS. $3B_1$ and $3B_2$.

A pulse train from the generator 10 is coupled to a double differentiator 14 wherein the pulses are differentiated to produce an A.C. signal proportional to the left rear wheel speed. Similarly, the pulse train from the generator 12 is connected to an input of a double differentiator 16 wherein the pulses are differentiated to produce an A.C. signal related to the left rear wheel speed.

The output signals from the double differentiator 14 are coupled to inputs of the integrator 14', wherein the differentiated signals are integrated to produce a D.C. voltage having a magnitude related to the left rear wheel speed. Similarly, the differentiated signal from the double differentiator 16 are coupled to inputs of the integrator 16', wherein the differentiated signals are integrated to produce a D.C. voltage having a magnitude related to the right rear wheel speed. The output signals from the integrators 14' and 16' have waveforms as illustrated in FIG. 3D$_1$.

The generator 10, the double differentiator 14, and the integrator 14' comprise a frequency converter for the signal produced at left rear wheel sensor, and the generator 12, the double differentiator 16, and integrator 16' comprise a frequency converter for the right rear wheel sensor.

The speed dependent voltages from the integrators 14' and 16' are connected to inputs of a input amplifier 18, which has two output signals both proportional to the average of the output voltages of the integrator circuits. One output (F$_1$) from the input amplifier 18 connects to a deceleration rate driver 20, which amplifies the signal for an input to a deceleration rate detector 22. The second output (F$_2$) of the input amplifier 18 connects to an acceleration rate driver 24, which produces a signal for the input of an acceleration rate detector 26. An output (H) from the deceleration rate driver 20 also connects to an input of a vehicle velocity ramp generator 28, and a variable speed switch 30 via line 33. A second input to the vehicle velocity ramp generator 28 is a signal from a logic gate 32 via line 34. A clamping circuit (not shown) in the acceleration rate detector 26, and a latch circuit 36 also connect to the ramp generator 28 (see output terminals K$_1$ and K$_2$).

Additional inputs to the variable speed switch 30, other than the voltage proportional to wheel speed, include a ramp current from the ramp generator 28, as illustrated at FIG. 3K$_3$, an inhibit signal from the output amplifier 46, as illustrated at FIG. 3O, and a retarding force current from a retarding force detector 40, as illustrated at FIG. 3L. The retarding force detector 40 has as an input a voltage that varies in accordance with the brake inhibit signals as illustrated at FIG. 3O, as will be desired. An output terminal (M) of the variable speed switch 3O connects to one input of a logic gate 32 and the output terminal (J) of the acceleration rate detector 26 connects to a second input of the logic gate 32. The output waveform from the speed switch 30 and acceleration rate detector 26 are shown at FIGS. 3M and 3J, respectively.

In addition to a connection to the vehicle velocity ramp generator 28, the latch circuit 36 also ties to the deceleration rate detector 22, the logic gate 32, and the latch inhibit circuit 44. An input to the latch inhibit circuit 44 is coupled from the logic gate 32 via line 34.

To complete the block diagram of the control module of FIG. 2, the output of the deceleration rate detector 22 is connected to a third input of the logic gate 32, which has one of its output voltages tied to the input of the output amplifier 46. The output amplifier 46 energizes a solenoid 48 that forms part of an actuator unit (not shown) that blocks pressure from the master cylinder in the hydraulic braking system of an automobile.

In operation of the control module of FIG. 2, the frequency varying signals (A$_1$) generated at the right rear wheel sensor and the left wheel sensor are converted in the square wave generators 10 and 12, the double differentiators 14 and 16, and the integrators 14' and 16', respectively, into D.C. voltages that are averaged in the input amplifier 18 to produce inputs to the deceleration rate detector 22 through the driver 20 and the acceleration rate detector 26 through the driver 24. The deceleration rate detector 22 generates signals as one input to the logic gate 32 whenever the deceleration rate of the rear wheels exceeds a set limit. The acceleration rate detector 26 generates a signal as another input to the logic gate 32 which also receives an input from the variable speed switch 30. To inhibit normal brake control, the output amplifier 46 energizes solenoid 48 when both the detectors 22 and 26 generate a signal at the input to the logic unit 32, and when the variable speed switch 30 provides a third input to the logic gate 32 at the brake inhibit level. When all three inputs to the logic gate 32 are at a brake inhibit level, the output amplifier 46 energizes the solenoid 48. The variable speed switch 30 will generate the third input to the logic gate 32 whenever the three input signals thereto satisfy preset conditions, and the switch itself is not inhibited from operating.

In a typical skid control operation, the automobile operator applies pressure to the brake pedal to actuate the hydraulic brake system in the usual manner. The speed of the rear wheels begins to slow down as illustrated by the first negative slope of the waveform of FIG. 3H. This signal appears at one of the outputs of the deceleration rate driver 20. When the deceleration rate detector 26 senses that the rate of decrease is in excess of a preset value, which indicates that a skid is imminent, it produces a control signal (I) at the brake inhibit level as one input to the logic gate 32. The acceleration rate detector 26 also produces a signal (J) at the brake inhibit level as a second input to the logic gate 32 since the rear wheel speed is decreasing. Whenever the speed of the rear wheels slows below the value established in the variable speed switch 30, the logic unit 32 receives a third input (M) at the brake inhibit level. When all inputs to the logic gate 32 are at the brake inhibit level, the output amplifier 46 generates a brake inhibit pulse (O) to energize the solenoid 48. Energizing this solenoid, as explained previously, releases the hydraulic pressure applied to the rear wheels thereby inhibiting braking action.

With the braking action inhibited, the rear wheels begin to spin-up to the speed of the vehicle as illustrated by the first positive slope of the curve of FIG. 3H. The operation of the system now depends on the braking conditions including the coefficient of friction of the road surface. Assume a high coefficient of friction, high-mu, for the road surface, the rear wheel speed increases rapidly. When the rate of rear wheel acceleration exceeds the preset level in the acceleration rate detector 28, the detector trips and the output changes to a normal braking level. This causes the output (J) to the logic gate 32 to return to a normal braking level, and in turn de-energizes the solenoid 48. De-energizing the solenoid 48 reapplies hydraulic pressure and a second inhibit cycle commences.

To prevent the acceleration rate detector 26 from de-energizing the solenoid 48 before the rear wheels have attained the speed which will bring them up to vehicle speed, the vehicle velocity ramp generator 28 supplies a signal (K$_1$) to the acceleration rate detector 26 to inhibit the action thereof. The signal from the generator 28 will be a ramp current proportional to vehicle speed as illustrated in FIG. 3K$_1$. This signal connects to the acceleration rate detector 26 to inhibit the operation thereto until the rear wheel speed reaches a preset level below vehicle speed. Typically, the acceleration rate detector 26 is inhibited from operating until the differential between wheel speed and vehicle speed is on the order of ten miles per hour. When the vehicle speed drops below ten miles per hour, the signal from the velocity ramp generator 28 no longer affects the operation of the detector 26 and it will operate immediately upon sensing an acceleration of wheel speed in excess of the preset level. Thus, on high coefficient of friction road surfaces, the acceleration rate detector 26 will return the braking system to normal operation by de-energizing the solenoid 48 whenever the wheel speed exceeds a preset acceleration rate and is within a fixed differential of vehicle speed.

Next assume the automobile is traveling on a low coefficient of friction (low-mu) road surface (ice, water covered surfaces, etc.). When the driver suddenly jams on the car brakes the rear wheels start decelerating as explained previously. The deceleration rate detector 22, in combination with the acceleration rate detector 26, and the variable speed switch 30 inhibits the normal braking action by energizing the solenoid 48. On a low-mu surface the rate of acceleration of the rear wheels during the inhibit cycle is too slow to disarm the acceleration rate detector 26, so it remains in an ON state. Also, since the speed switch output of the variable speed switch 30 is clamped at the brake inhibit level, it also continues to provide an input to the logic gate 32. This leaves only the deceleration rate detector 22 to function to de-energize the solenoid 48. Since the output of the output amplifier 46 is holding the brakes off, the rear wheels start to spin-up. When this occurs, the deceleration rate detector 22 loses its arming voltage and begins the process of returning the output thereof to the normal braking level. When the output of the rate detector 22 returns to the normal braking level, one of the three required inputs that energizes the solenoid 48 is lost and the solenoid is de-energized.

The time required for the deceleration rate detector 22 to switch from the brake inhibit level to the normal braking level is decreased or increased by the rate of the spin-up of the rear wheels. Therefore, when on a low-mu surface where the rate of spin-up is slow compared to a high-mu surface, the solenoid 48 will be energized for a longer period of time. Also, during wheel spin-up, the latch current from the latch circuit 36, which is related to automobile velocity by a signal from the ramp generator 28, increases the time required for the deceleration rate detector 22 to switch from the brake inhibit level to the normal braking level after losing its arming voltage. Without the latch current, the deceleration rate detector 22 would remain at the brake inhibit level for an insufficient length of time on a low-mu surface at low vehicle speeds. The function of the latch current then is to extend the brake inhibit time over that normally developed by operation of the deceleration rate detector.

In addition to the deceleration rate detector 22 and the acceleration rate detector 26, the variable speed switch 30 also influences the length of time the normal braking action will be inhibited. Before the variable speed switch 30 produces an output at a brake inhibit level to the logic gate 32, a sum of a first input current related to rear wheel speed, a second input current from the vehicle velocity ramp generator 28, and a third input current from the retarding force detector 40 must exceed a threshold level. Basically, the variable speed switch 30 comprises a summing amplifier operating as a switch. A current signal related to vehicle speed from the generator 28, and a current signal from the retarding force detector 40, which is related to road conditions, modifies the switching level of the variable speed switch 30. In other words, the vehicle velocity ramp generator 28 and the retarding force detector 40 change the rear wheel speed at which the switch 30 produces a brake inhibit level signal. For example, when an automobile travels on a low-mu surface, the detector 40 increases the wheel speed switching level of the switch 30 so that the solenoid 48 will be energized at a higher speed. On the other hand, as the vehicle speed decreases, the generator 28 reduces the wheel speed at which the switch 30 will produce a signal at the brake inhibit level. The current waveforms of the signals from the generator 28 and the detector 40 are illustrated in FIG. $3K_3$ and FIG. 3L, respectively.

Figure 4A:
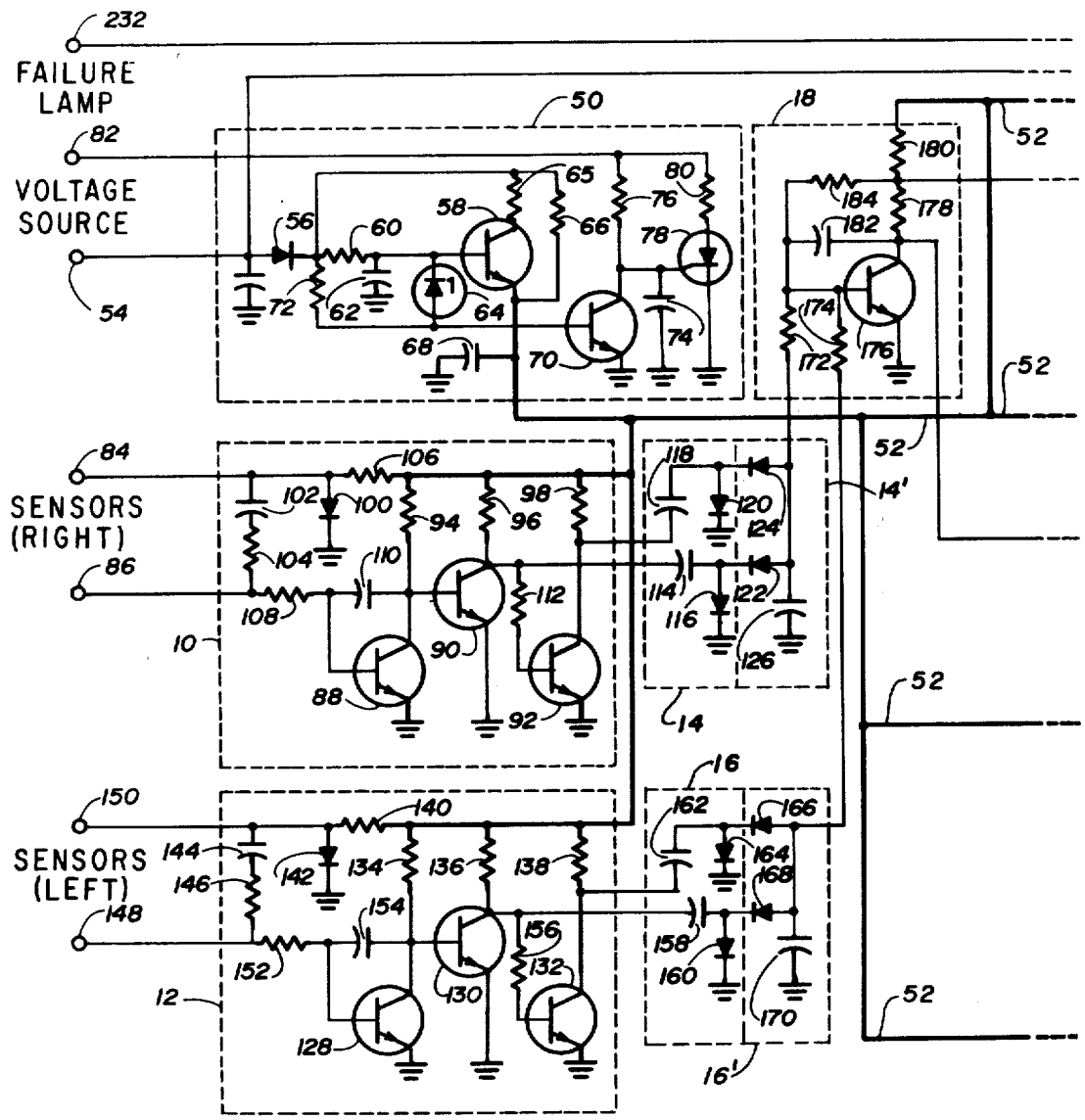
FIGS. 4A and 4B is a two sheet schematic of a solid state control module for producing "pulsing" action in a vehicle skid control braking system, such sheets being connected by the dashed lines appearing along the right and left sides of the drawings, respectively.
Figure 4B:
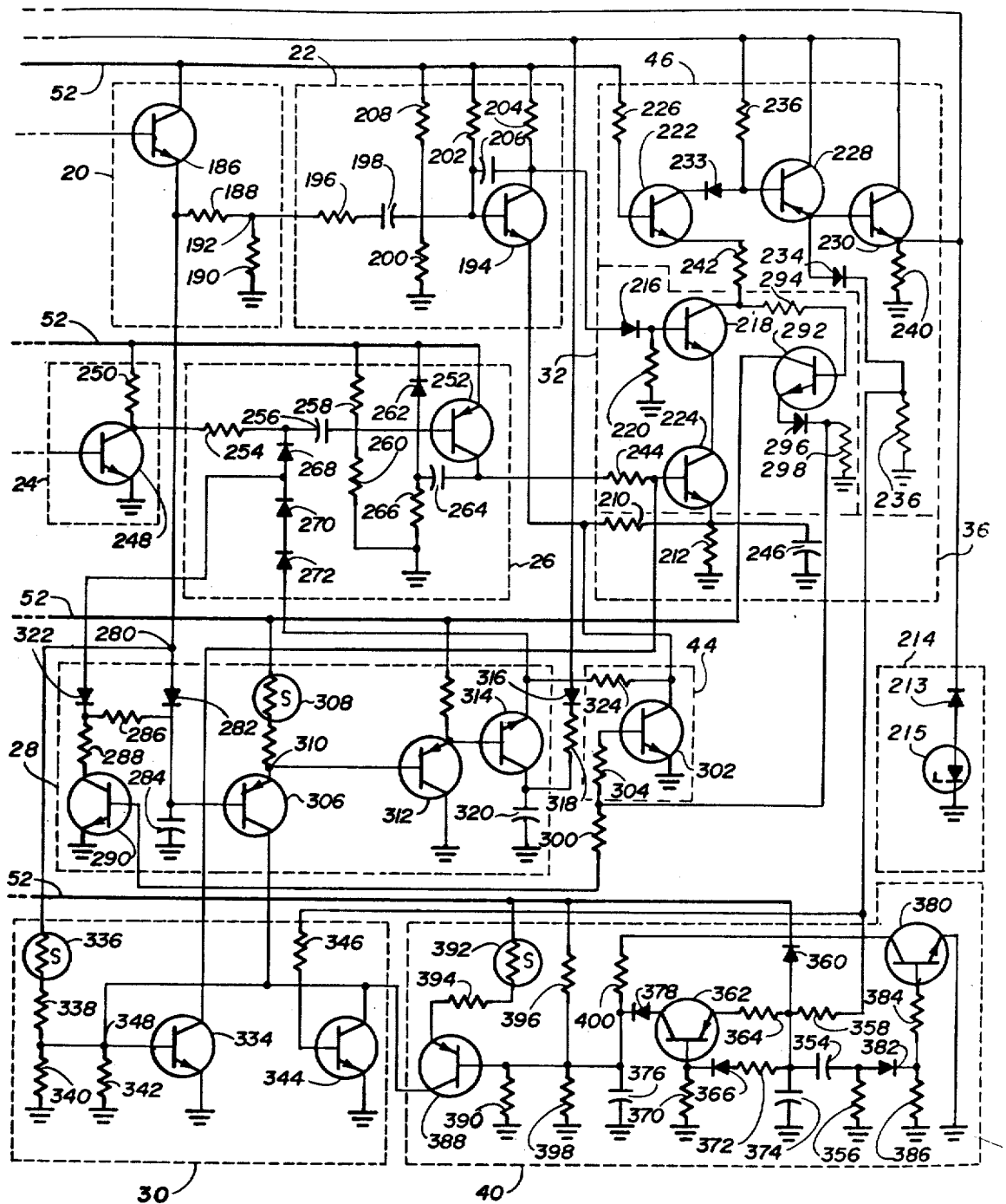

Referring to FIGS. 4A and 4B, there is shown a detailed schematic of a skid control module in accordance with the present invention, including a voltage regulator 50 for producing a positive D.C. regulated voltage on a line 52. The voltage regulator 50 operates from the automobile battery connected to a terminal 54. The car battery voltage connects through a diode 56 to the base electrode of a transistor 58 through a base drive resistor 60. Also connected to the base drive circuit of the transistor 58 is a capacitor 62 and a diode 64. The collector circuit for the transistor 58 includes resistors 65 and 66. The regulated D.C. voltage output from the regulator 50 appears at the emitter electrode of the transistor 58. A smoothing capacitor 68 eliminates unwanted high frequency ripple from the regulated voltage.

Included in the regulator 50 is a failure lamp driver which comprises a transistor 70 connected to the diode 56 through a resistor 72. The failure lamp driver circuit also includes a capacitor 74, a resistor 76, and a silicon controlled rectifier 78, all connected to the collector electrode of the transistor 70. The resistor 76 and the anode of the rectifier 78, are connected through a resistor 80 to a failure lamp (not shown) tied to the terminal 82.

In addition to other parts of the control module, the D.C. regulated voltage on line 52 supplies drive current for the transistors of the generators 10 and 12. As explained, the generator 10 receives a frequency varying signal from the right rear wheel sensor connected to terminals 84 and 86, as illustrated by the waveform at FIG. $3A_1$. A diode 100 biases the terminal 84 one diode drop above ground potential. A capacitor 102 in series with a resistor 104 filters unwanted noise components from the frequency signal generated by the wheel sensor. The frequency varying input to the generator 10 is amplified by a transistor 88, clipped by a transistor 90, and inverted by a transistor 92. These transistors are all in a common emitter configuration and have a collector connection to the line 52 through resistors 94, 96 and 98, respectively. A resistor 106 and the diode 100 establish the base drive voltage for the transistor 88. The base drive circuit for the transistor 88 also includes a base resistor 108. To stabilize the operation of the transistor 88, a feedback capacitor 110 is tied between the collector electrode and the base electrode. The transistor 90 is direct coupled to the collector electrode of the transistor 88 to complete the clipping circuit. The inverting transistor 92 is coupled to the output of the transistor 90 through a base resistor 112.

Two square wave pulse trains are produced by the generator 10, as shown at FIGS. $3B_1$ and $3B_2$. These pulse trains are similar except that one is phase shifted 180° from the other. The square wave produced by the transistor 90 is differentiated in the double differentiator circuit 14 by a capacitor 114 connected to the anode electrode of a diode 116 to produce a series of voltage spikes as shown at FIG. $3C_1$. The inverted pulse train from the transistor 92 is likewise differentiated in the double differentiator circuit 14 by a capacitor 118 connected to the anode electrode of a diode 120 to produce a series of voltage spikes as shown at FIG. $3C_2$. An integrator 14' including diodes 122 and 124 interconnected to a capacitor 126 integrates the pulses resulting from differentiating the square waves generated at the transistors 90 and 92. The output of the integrator 14' is a voltage having a high ripple content with the average value displaced from zero by an amount related to the frequency of the signal connected to the input terminals 84 and 86 as shown at FIG. $3D_1$. Higher frequency signals generate closer spaced voltage spikes which result in an average value with a greater displacement from zero. A very slowly varying signal at the input terminals 84 and 86 results in an average value for the wave at the interconnection of the diodes 122 and 124 only slightly displaced from the zero voltage level.

The generator 12 is similar to the generator 10 and includes an amplifying transistor 128 direct coupled to a clipping transistor 130 which in turn connects to an inverter transistor 132. Resistor 134, 136 and 138 establish the collector currents for each of the transistors in the order presented. A resistor 140 and a diode 142 establishes the base drive voltage for the transistor 128. A capacitor 144 in series with a resistor 146 filters unwanted noise components from the frequency signal generated by the left wheel sensor as connected to the terminals 148 and 150. A base drive resistor 152 connects to the base electrode of the transistor 128 and a capacitor 154 stabilizes the operation of this transistor. A base drive resistor 156 couples the transistor 130 to the transistor 132. Two square wave pulse trains having a 180° phase shift are generated by the generator 12. These two pulse trains are connected to the circuit 16 that includes a capacitor 158 connected to the anode of a diode 160 for differentiating the pulse train generated at the transistor 130 and a capacitor 162 connected to the anode electrode of a diode 164 for differentiating the pulse train generated at the transistor 132. Voltage spikes resulting from differentiating the square wave pulse trains are integrated by diodes 166 and 168 interconnected to a capacitor 170. The output of the differentiator and integrator 16 is a voltage having a high ripple content with an average value displaced from zero by an amount related to the left rear wheel speed which is similar to the waveform of FIG. $3D_1$.

Outputs from the integrators 14' and 16' are connected to input resistors 172 and 174, respectively, of the input or summing amplifier 18. Resistors 172 and 174 are interconnected to the base electrode of a transistor 176 in a common emitter configuration. The collector electrode of the transistor 176 connects to the line 52 through resistors 178 and 180. The collector of transistor 176 also connects to a feedback capacitor 182. A base electrode voltage is established at the transistor 176 by a resistor 184 connected to the junction of resistors 172 and 174 and to resistor 180. The summing amplifier 18 combines and averages the wheel speed voltages and produces two outputs both proportional to the average speed of the rear wheels.

One output ($F_1$) of the summing amplifier 18 appears at the junction of resistors 178 and 180 and connects to the base electrode of a transistor 186 in the deceleration driver 20. The driver 20 merely provides isolation for the summing amplifier 18. In addition to the transistor 186, which connects to the line 52, through the collector electrode, the driver 20 includes a voltage divider network of resistors 188 and 190. The deceleration driver 20 produces two oputputs one at the emitter electrode of transistor 186 and the other at the junction 192 between resistors 188 and 190.

The output of the driver 20 at the junction 192 is the input to the deceleration rate detector 22. A voltage at the junction 192 drives the base electrode of a transistor 194 through a resistor 196 and a capacitor 198. Resistors 200, 202 and 208 connect between the line 52 and ground to bias the transistor 194 into a conducting state. The collector circuit for the transistor 194 includes a feedback capacitor 206 and a resistor 204 connected to the line 52.

The rate of deceleration of the rear wheel speed that produces a brake inhibit output from the deceleration rate detector 22 is determined by the RC time constant of the capacitor 198 and the resistor 208. To return the output of the rate detector 22 from the brake inhibit level to the normal braking level, the voltage at the junction 192 must drive the voltage at the base of transistor 194 such that it exceeds the voltage established at the emitter electrode of the transistor 194 by the base-to-emitter voltage. The emitter voltage is established by a voltage divider network including resistors 210 and 212, as part of a brake controller 214.

At the upper right hand corner of FIG. 4B there is illustrated the logic gate 32, the latch circuit 36, and the output amplifier 46 of FIG. 2. Resistors 210 and 212 and capacitor 246 are part of the latch circuit 36.

An output from the deceleration rate detector 22 connects to the base electrode of a transistor 218 in the logic gate 32 through an isolating diode 216. The base electrode circuit of the transistor 218 also includes a resistor 220. Transistor 218 is part of a logic sequence circuit that consists of transistors 222 and 224. Transistor 222 is biased in the ON condition by a connection through a resistor 226 to the line 52, thereby establishing a fixed emitter voltage. The emitter electrode of the transistor 222 connects to the collector electrode of the transistor 218 through a resistor 242.

Current through the collector-emitter junction of the transistor 222 of the output amplifier 46 provides a base drive for a first output transistor 228. A second output transistor 230 connects to the transistor 228 and generates the energizing voltage for the solenoid 48 (not shown) connected to the terminal 232. Energizing pulses for the solenoid 48 are shown at FIG. 3O. In addition to the transistors 228 and 230, the output circuit of the amplifier 46 includes diodes 233 and 234, and resistors 236, 238 and 240. A voltage that follows the output of the amplifier 46 is developed at the junction of the diode 234 and the resistor 236. The remaining circuitry of the amplifier 46 includes a base resistor 226 connected to the base of transistor 222.

The second output of the summing amplifier 18, at the collector electrode of transistor 176, provides a base drive for a transistor 248 in the acceleration rate driver 24. Transistor 248 is in a common emitter configuration and has a collector circuit including a resistor 250 connected to the line 52. An output signal from the driver 24 drives the base electrode of a transistor 252 in the acceleration rate detector 26. The base circuit of the transistor 252 consists of a resistor 254 in series with a capacitor 256. A resistance network including resistors 258 and 260, connected between the line 52 and ground, establishes a bias level for the transistor 252. A diode 262 clamps the base electrode of the transistor 252 one diode drop above the emitter electrode which connects to the line 52. A feedback capacitor 264 stabilizes the operation of the transistor 252.

The rate of rear wheel acceleration that changes the output of the acceleration rate detector 26 from a brake inhibit level to a normal braking level is determined by the RC time constant of the capacitor 256 and a resistor 266. A series of three diodes 268, 270 and 272, connect to the junction of resistor 254 and the capacitor 256, establish the wheel speed below which the acceleration rate detector 26 is inhibited from functioning as a detector. The output of the acceleration detector 26 couples to the base electrode of the transistor 224 in the logic gate 32.

Coupled to the output of the deceleration rate driver 20 at the emitter electrode of the transistor 186 is the vehicle velocity ramp generator 28 that consists of a velocity ramp circuit, a velocity sensitive speed circuit, and a velocity sensitive latch circuit. The velocity sensitive latch circuit is coupled to the latch inhibit circuit 44. An input signal to the vehicle velocity ramp generator 28 at the terminal 280 forward biases a diode 282 to charge a capacitor 284 to a level proportional to the wheel speed voltage. Connected to the junction of the diode 282 and a capacitor 284 is part of a controlled rate discharge circuit including series resistors 286 and 288 connected to the collector electrode of a transistor 290. A base drive voltage for the transistor 290 is generated in the emitter circuit of a transistor 292 of the logic gate 32. Transistor 292 in turn is controlled between a conducting and non-conducting state by pulse signals coinciding with the brake inhibit pulses as generated at the collector electrode of the transistor 218. A voltage at the collector electrode of the transistor 218 drives the base electrode of the transistor 292 through a resistor 294. To complete the circuit for the transistor 292, the collector electrode connects to line 52 and the emitter circuit includes a diode 296 and resistors 298 and 300. The emitter voltage of the transistor 292 also provides a base drive to the inhibit transistor 302 of the latch inhibit 44 through a base resistor 304.

A voltage at the storage capacitor 284 couples to the base electrode of a transistor 306 in the velocity sensitive speed circuit. The remaining circuitry coupled to the transistor 306 includes a sensor 308 (a resistor variable with temperature) in series with a resistor 310. The output current ramp produced by the transistor 306 varies inversely with vehicle speed and is illustrated in FIGS. 3K$_1$K$_2$.

Also connected to the emitter electrode of the transistor 306 is the base electrode of a transistor 312 in the circuit 278. The emitter electrode of a transistor 312 in turn connects to the base electrode of a transistor 314 which has the emitter electrode connected to the diodes 268, 270 and 272 in the acceleration rate detector 26. The waveform of the voltage at the emitter electrode of the transistor 314 is proportional to vehicle speed as shown at FIG. 3K$_3$. Connected to the cathode of the diode 270 is a diode 322 in the circuit 274. The collector circuit of the transistor 314 includes a diode 316, a resistor 318, and a capacitor 320.

In operation of the vehicle velocity ramp generator 28, a charge is stored on the capacitor 284 by connecting wheel speed voltages to the terminal 280 as explained previously. To control the discharge of the capacitor 284 to produce the ramp function, the voltage drop across the resistor 286 is held at two diode drops, approximately one volt. This two diode voltage drop across the resistor 286 is maintained by the diode drops across the transistors 306, 312 and 314, and the voltage drop across the diodes 272, 270 and 322. During the controlled rate discharge of the capacitor 284, the transistor 290 is turned on by operating the transistor 292 in a saturated condition when no output signal occurs at the emitter electrode of the transistor 230 of the controller 214. Thus the discharge path of the capacitor 284 includes the resistors 286 and 288 and the transistor 290.

When an output pulse appears at the terminal 232, the transistor 292 turns off, which in turn turns off the transistor 290, thereby interrupting the discharge path for the capacitor 284. The charge remaining on the capacitor 284 will then be held at some fixed level since the voltage at the capacitor 284 will be greater than any wheel speed voltage at the terminal 280, thus back biasing the diode 282. The capacitor voltage will drive the transistor 306 to produce a ramp current as one input to the variable speed switch 30, as will be explained. A voltage proportional to vehicle speed also appears at the emitter electrode of the transistor 314 and a voltage equal to three diode drops less than the vehicle speed voltage will appear at the junction of the resistor 254 and the capacitor 256 in the acceleration rate detector 26.

In the operation of the acceleration rate detector 26, whenever the rate of rear wheel acceleration is less than a preset value as determined by the RC time constant of the capacitor 256 and the resistor 266, the transistor 252 conducts thereby clamping the output at the voltage on line 52. With a voltage three diode drops less than the vehicle speed voltage at the junction of resistor 254 and capacitor 256, the transistor 252 will be biased into a conducting state regardless of the rear wheel acceleration rate. That is, unitl the rear wheel speed produces a voltage at the collector electrode of the transistor 248 in excess of that established by the diodes 268, 270 and 272. Since the voltage at the emitter electrode of the transistor 314 decreases with vehicle speed during a braking action, the inhibit voltage at the capacitor 256 will likewise decrease with vehicle speed. When the detector 26 is not inhibited from operating, a voltage at transistor 248 that increases at a rate in excess of that set by the capacitor 256 and the resistor 266 will turn off the transistor 252, thereby allowing the collector electrode to drift to the potential at the capacitor 262.

Also coupled to the emitter electrode of the transistor 314, through a resistor 324, is the latch circuit 36 which includes resistors 210 and 212. With no output at the terminal 232, the transistor 292 will be conducting which in turn will turn on the transistor 302, thereby clamping the emitter electrode of the transistor 194 of the deceleration rate detector 22 at ground potential. The transistor 194 will normally be biased in a conducting state and the collector electrode thereof will be clamped to ground through transistor 302. When the rate of deceleration of the rear wheels exceeds the limit established by the capacitor 198 and the resistor 208, the transistor 194 turns off and the collector electrode thereof will raise to the potential of line 52. If the transistor 252 is also conducting and the variable speed switch 30 unclamps the base electrode of the transistor 224 from ground, both the transistors 218 and 224 will be conducting and an output signal will appear at the terminal 232 to energize the solenoid 48. Conduction of the transitors 218 and 224 clamps the base electrode of the transistor 292 to ground potential, thereby turning off this transistor. Turning off transistor 292 also turns off the transistor 302 and the emitter electrode of the transistor 194 raises to the emitter voltage of the transistor 314 plus the voltage drop across the resistor 212. Since the voltage at the emitter electrode of transistor 314 varies with vehicle speed, the emitter voltage of the transistor 194 will be equal to the voltage drop across the resistor 212 plus a voltage that varies with vehicle speed. For faster vehicle speeds, a higher emitter voltage will be present at the transistor 194. At low vehicle speeds, only the voltage drop across the resistor 212 will establish the emitter voltage of the transistor 194 during a brake inhibit cycle.

Assume a low-mu road surface, the rear wheels will not accelerate at a rate fast enough to activate the acceleration rate detector 26. However, the deceleration rate detector 22 loses its arming voltage and the RC network of capacitor 198 and resistor 208 starts to discharge. As soon as this RC network has discharged such that the base drive voltage for the transistor 194 is one base-to-emitter drop above the emitter voltage, transistor 194 is cut off. Note that, since the emitter voltage for the transistor 194 varies with vehicle speed, an output pulse will appear at the terminal 232 for a longer period of time than would be possible if the emitter electrode was fixed at ground potential.

Figure 5:
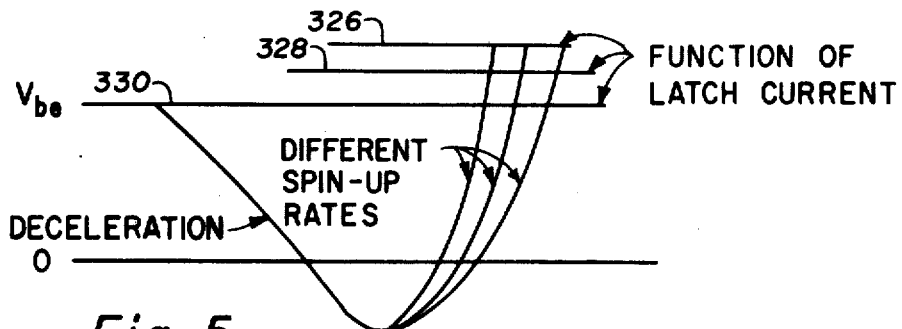
FIG. 5 is a plot of wheel speed voltage versus time showing the switching speed of the automatically adjustable switching circuit.

Referring to FIG. 5, there is shown three different spin-up rates for the rear wheels and three different latch levels for the transistor 194. During a normal braking cycle, a voltage at the junction 192 decreases as the rear wheels decelerate. When the rate of deceleration turns off the transistor 194 and the speed switch 30 clamps the transistor 224, a brake inhibit cycle commences. The rear wheels then begin to spin-up at a rate determined by the coefficient of friction of the road surface. For the first inhibit cycle after a braking sequence begins when the vehicle is traveling at a high rate of speed, the emitter voltage of transistor 194 will be established at a level given by the line 326 of FIG. 5. For any of the three spin-up rates illustrated, the transistor 194 will remain in a non-conducting state until the base electrode thereof exceeds the voltage represented by the line 326 by an amount equal to a base-emitter voltage drop. For the next inhibit cycle, when the car is moving at a slower speed, the latch voltage at the emitter electrode of the transistor 194 will be set at a level represented by the line 328 of FIG. 5. To switch the deceleration rate detector 22 from a brake inhibit level to a normal braking level, the voltage at the base electrode of the transistor 194 must now exceed a voltage at a level of the line 328 by a base-to-emitter drop. In still a subsequent cycle, the latch voltage for the transistor 194 will be at a level represented by the line 330. During this cycle, before the deceleration rate detector 22 will return the system to normal braking, the base electrode of transistor 194 must exceed the voltage represented by line 330. Thus, the amount of time the deceleration rate detector 22 inhibits normal braking operation depends upon the spin-up rate of the rear wheels and the vehicle speed.

The third circuit that must be satisfied to produce a brake inhibit signal at the terminal 232 is the variable speed switch 30. In FIGS. 4A and 4B, the variable speed switch 30 receives at one of its inputs a voltage varying with wheel speed, as generated at the emitter electrode of the transistor 186 in the deceleration rate driver 20. A transistor 334 connects to a drive circuit for receiving the wheel speed voltage and includes a sensitor 336 in series with resistors 338 and 340. The junction of the resistors 338 and 340 ties to a resistor 342 and the collector electrode of an inhibit transistor 344. Also connected to the base electrode of the transistor 334 is an input that varies inversely with the vehicle speed as produced at the collector electrode of the transistor 306 in the velocity sensitive speed circuit 276. A current signal from the retarding force detector 40 is also connected to the base electrode of transistor 334. Both the transistors 334 and 344 are in a common emitter configuration with the collector electrode of the former connected to the base electrode of the transistor 224 and a base electrode of the latter through a resistor 346 to a pulse waveform similar to the waveform appearing at the output terminal 232.

In operation, a current signal having a waveform as illustrated in FIG. $3K_1K_2$ is applied to the base electrode of the transistor 334, along with a current signal having a waveform as illustrated in FIG. 3L. These two currents are summed at the junction 348, to produce a base drive that saturates the transistor 334, thereby clamping the base electrode of the transistor 224 to ground. As the rear wheel speed decreases, a voltage applied to a circuit including the sensitor 336, and the resistors 338 and 340 produces a current at a junction 348 to turn off the transistor 334. This unclamps the base electrode of the transistor 224 thereby allowing the output of the acceleration rate detector 26 to control this transistor.

When an output voltage pulse appears at the resistor 236, the transistor 334 saturates to clamp the junction 348 at ground potential. Now, as the wheel speed increases during a brake inhibit cycle the transistor 334 remains turned off. When the output of the amplifier 46 again returns to the normal braking level, the transistor 344 turns off and the transistor 344 is driven into saturation by the current signals varying inversely with vehicle speed and with braking conditions.

Note that both the current waveforms at FIG. $3K_1K_2$ and FIG. 3L increase for subsequent braking cycles indicating that the switching speed of the transistor 334 will change for each subsequent brake inhibit cycle. During the next application of brake pressure to the rear wheels, a lower rear wheel speed will have to be reached before the transistor 334 turns off. When the transistor 334 is again switched off, the base electrode of the transistor 224 will be released and another control signal connected to the output amplifier 46. The train of output pulses appearing at the terminal 232 is illustrated in FIG. 3O with the output pulses from the variable speed switch 30 illustrated at FIG. 3M.

Figure 6:
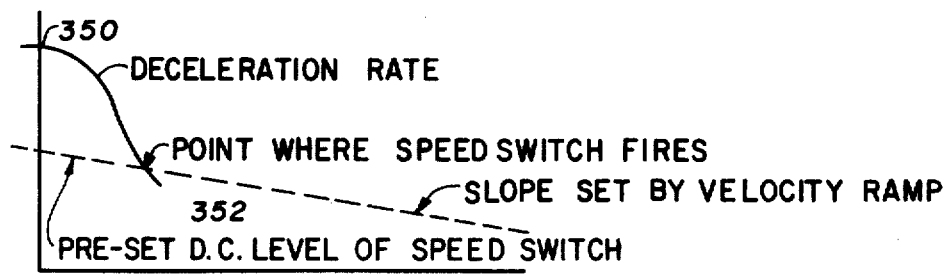
FIG. 6 illustrates a series of curves for different wheel "spin-up" rates as a function of road conditions.

Referring to FIG. 6, there is shown a plot of speed versus time. The rear wheels decelerate during a braking cycle to produce a voltage which varies along the curve 350. When this curve passes through the line 352 the transistor 334 turns off. Note that the line 352 has a slightly negative slope. The slope of this line is set by the vehicle speed and modified by braking conditions. Thus, on a subsequent braking cycle after an inhibit cycle, the wheel speed will have to decrease to still a lower value than the preceding braking cycle.

Returning to FIGS. 4A and 4B, an input to the retarding force detector 40 is a series of pulses coinciding with the output pulses of the amplifier 46. This series of pulses is generated at the resistor 236 and connected through a resistor 358 to a differentiator circuit including a capacitor 354 and a resistor 356. The capacitor 354 also connects to the line 52 through a diode 360. Both the regulated voltage supply and the pulses from the resistor 236 are also connected to the emitter electrode of a constant current source transistor 362 through a resistor 364. The constant current circuit includes the transistor 362 and a base biasing circuit consisting of a diode 366 and resistors 370 and 372. A capacitor 374, connected to the resistor 372, completes the biasing circuit for the transistor 362. The collector electrode of the transistor 362 connects to an information storage circuit including a capacitor 376 and a diode 378.

The differentiated leading edge of the pulses at the resistor 236 generate a base drive at the junction of the capacitor 354 and the resistor 356 for a reset transistor 380. These pulses are applied to the base of the transistor 380 through an isolating diode 382 and a base resistor 384. A resistor 386 completes the base drive network for the transistor 380. The junction of the capacitor 376 and the diode 378 is tied to the collector electrode of the reset transistor 380 and a divider network including resistors 396 and 398.

At the output of the retarding force detector 40, a transistor 388 provides current amplification of the voltage at the junction of the storage capacitor 376 and the diode 378. The base drive circuit of the transistor 388 includes a resistor 390. A sensor 392 connected to the line 52, and in series with a resistor 394, completes the emitter circuit for the transistor 388.

In operation, a voltage at the resistor 236 turns on the transistor 362 to produce a constant current in the collector-emitter junction which forward biases the diode 378 to charge the storage capacitor 376. Charging of the capacitor 376 increases along a linear curve. This charging action takes place during the brake inhibit cycle of the output amplifier 46, that is, when an inhibit pulse appears at the terminal 232. When the amplifier 46 turns off, the transistor 362 is likewise turned off and the charging action of the capacitor 376 stops. By means of the resistors 396, 398 and 390, the capacitor 376 begins a slow discharge. This slow discharging action continues until another inhibit pulse appears at the output of the amplifier 46. The leading edge of the next inhibit pulse is differentiated by the capacitor 354 and the resistor 356 to produce a positive base drive pulse to the transistor 380. A positive pulse at the base of the transistor 380 saturates the transistor to clamp the junction of the capacitor 376 and the diode 378 to ground through a resistor 400. This immediately discharges the capacitor 376 to a level determined by the conducting time of the transistor 380. When the base drive to the transistor 380 returns to a zero voltage level, the capacitor 376 again begins to charge through the transistor 362 which has again been turned on.

The voltage at the junction of the capacitor 376 and the diode 378 provide the base drive signal for the transistor 388 to produce a current waveform to the speed inhibit switch 30, as illustrated in FIG. 3L. Note that the base line for the curve of FIG. 3L has a slight positive slope. The amount of this slope is a function of the braking forces including the condition of the road surface. It is the base line of this wave that comprises the current signal connected to the speed switch circuit 30.

Although the foregoing description of several embodiments of this invention discloses right and left rear wheel sensors for generating signals proportional to the wheel speed of the vehicle under control, it is contemplated that other techniques for generating signals proportional to wheel speed may be utilized without departing from the spirit and scope of this invention. By way of example, a vehicle drive-shaft sensor has been found satisfactory for generating reliable signals that are proportional to wheel speed. In this configuration of the invention, only one input channel is required, such as the frequency converter 11 of FIG. 1 or the square wave generator 12 of FIG. 2, and the summing or input amplifiers 15 and 18 of FIGS. 1 and 2, respectively, would be conventional amplifiers. The remaining circuit elements of FIGS. 1 and 2 would be the same as above described in this alternate embodiment of this invention. Of course, the other channels, converter 13 or generator 10, are appropriately eliminated. It is also contemplated that other types of sensors for producing signals proportional to vehicle wheel speed may be utilized without departing from the spirit and scope of this invention.

Although several preferred embodiments of the invention have been described in detail, it is to be understood that various changes, substitutions, and alterations can be made therein without departing from the spirit and scope of the invention.

What is claimed is:

1. A skid control module for a vehicle brake control system of the type that generates a brake control output signal varying in accordance with braking conditions, comprising in combination:
  (a) signal generating means for generating a variable A.C. signal proportional to vehicle wheel speed;
  (b) frequency converter means coupled to said signal generating means for converting said variable A.C. signal to a variable D.C. output signal proportional to vehicle wheel speed;
  (c) wheel speed rate detector means coupled to said frequency converter means for generating a first brake inhibit signal when the rate of change of said variable D.C. output signal varies from a predetermined wheel speed rate of change;
  (d) circuit means for generating signals proportional to selected braking conditions of the vehicle and the vehicle brake control system;
  (e) switching means coupled to said frequency converter means and said circuit means for generating a second brake inhibit signal when said selected braking conditions vary from predetermined parameters; and
  (f) brake controller means coupled to said wheel speed rate detector means and said switching means for generating said brake control signal when said first and second brake inhibit signals are applied thereto, thereby controlling the operation of said vehicle brake control system.

2. The skid control module of claim 1 wherein said circuit means includes means for generating a signal proportional to vehicle speed for adjusting the level at which said second brake inhibit signal is generated.

3. The skid control module of claim 1 wherein said circuit means includes means for generating a signal proportional to the coefficient of friction of the surface upon which said vehicle is traveling for adjusting the level at which said second brake inhibit signal is generated.

4. The skid control module of claim 1 and further including switch inhibit means responsive to said brake control signal, said switch inhibit means being coupled to said switching means for inhibiting the operation thereof during a brake inhibit cycle.

5. The skid control module of claim 1 wherein said wheel speed rate detector means includes:
  (a) a wheel speed deceleration rate detector means for generating a brake inhibit signal when the deceleration rate of change of said D.C. signal exceeds a predetermined deceleration rate of change; and
  (d) a wheel speed acceleration rate detector means for generating a brake inhibit signal when the acceleration rate of change of said D.C. signal exceeds a predetermined acceleration rate of change; wherein
  (c) the brake inhibit signals generated by both of said rate detectors are coupled to said brake controller means.

6. A skid control module for a vehicle brake control system of the type that generates a brake control signal varying in accordance with braking conditions, comprising in combination:
  (a) sensor means for generating a variable A.C. output signal proportional to vehicle wheel speed;
  (b) frequency converter means coupled to said sensor means for converting said A.C. signal to a variable D.C. output signal proportional to vehicle wheel speed;
  (c) wheel speed rate detector means coupled to said frequency converter means for generating a first brake inhibit signal when the rate of change of said variable D.C. output signal varies from a predetermined wheel speed rate of change;
  (d) first circuit means for generating a signal proportional to vehicle velocity;
  (e) second circuit means for generating a signal proportional to the coefficient of friction of the surface upon which said vehicle is traveling;
  (f) switching means coupled to said frequency converter means and said first and second circuit means for generating a second brake inhibit signal when said vehicle wheel speed, said vehicle velocity, and said coefficient of friction respectively vary from predetermined parameters; and
  (g) brake controller means coupled to said wheel speed rate detector means and said switching means for generating said brake control signal when said first and second brake inhibit signals are applied thereto, thereby controlling the operation of said vehicle brake control system.

7. The skid control module of claim 6, wherein said frequency converter includes:
  (a) pulse generating means responsive to said A.C. signal for generating a first series of pulses having a time displacement related to the frequency of said A.C. signal, and for generating a second series of pulses having a phase displacement from said first series of pulses; and
  (b) signal producing means connected to said pulse generating means and responsive to said first and second series of pulses for producing a D.C. signal having a magnitude related to and varying with the frequency of said A.C. signal.

8. The skid control module of claim 7, wherein said signal producing means includes a first differentiator-integrator connected to said first series of pulses, and a second differentiator-integrator connected to said second series of pulses.

9. The skid control module of claim 6, wherein said first circuit means is a ramp generator comprising:
  (a) storage means for storing a charge proportional to vehicle velocity;
  (b) control means having an output signal varying between a first value and a second value; and
  (c) discharge means connected to said control means for discharging said storage means at a controlled rate to a level determined by the varying of the output of said control means from said first value to said second value.

10. The skid control module of claim 9, wherein said discharge means includes a transistor having a base electrode connected to said control means output.

11. The skid control module of claim 10, wherein said storage means includes a diode connected at one terminal to the means for generating an independent variable signal and at another terminal to one terminal of a capacitor.

12. The skid control module of claim 11, wherein:
  (a) said discharge means further includes a resistor connected at one end to the common terminals of said diode and said capacitor, and at the other end to said transistor; and
  (b) a voltage clamping circuit for establishing the voltage drop across said resistor thereby controlling the rate of discharge of said capacitor.

13. The skid control module of claim 6, wherein said second circuit means is a pulse width detector comprising:
  (a) means for storing a charge when said brake control signal is at a first value, said charge increasing from a reset level and continuing until said brake control signal reaches a second value; and
  (b) reset means responsive to a reset pulse generated at each change of said brake control signal from said first value to said second value for discharging the stored charge in said storing means at the beginning of a subsequent brake control cycle.

14. The skid control module of claim 13, wherein said storing means includes a diode coupled to the output of said module and to a capacitor with the junction of said capacitor and said diode being connected to said reset means.

15. The skid control module of claim 14 and further including means for generating a reset pulse at each change of the brake control signal from said first value to said second value.

16. The skid control module of claim 15, wherein said reset pulse generator includes a differentiator circuit for differentiating the change in said brake control signal from said first value to said second value into a reset pulse.

17. The skid control module of claim 6, wherein said switching means is an automatically adjustable switch comprising:
  (a) a first transistor having a collector electrode connected to said brake controller means;
  (b) a second transistor having a base electrode connected to the output of said module, and a collector electrode connected to the base electrode of said first transistor for clamping said first transistor at a given conduction level; and
  (c) third circuit means for connecting said first and second circuit means to the base electrode of said first transistor, said first circuit means adjusting the operating level at which said second circuit means turns on said first transistor.

18. The skid control module of claim 17, wherein said third circuit means includes means for connecting said frequency converter means to the base electrode of said first transistor to further adjust the operating level of said first transistor.

19. The skid control module of claim 6 wherein said brake controller means includes:
   (a) logic gate means for generating said brake control signal; and
   (b) output amplifier means for amplifying said brake control signal and applying said brake control signal to a brake control actuator means.

20. The skid control module of claim 6 wherein said wheel speed rate detector means includes:
   (a) a wheel speed deceleration rate detector means for generating a brake inhibit signal when the deceleration rate of change of said D.C. signal exceeds a predetermined deceleration rate of change; and
   (b) a wheel speed acceleration rate detector means for generating a brake inhibit signal when the acceleration rate of change of said D.C. signal exceeds a predetermined acceleration rate of change; wherein
   (c) the brake inhibit signals generated by both of said rate detector means are coupled to said brake controller means.

21. A vehicle skid control braking system of the type that generates a brake control signal varying in accordance with vehicle speed, wheel speed and road surface conditions, comprising in combination:
   (a) frequency converter means responsive to a variable wheel speed signal for producing a D.C. signal having a magnitude related to and varying with the frequency of said variable wheel speed signal;
   (b) wheel speed rate detector means responsive to said D.C. signal for producing a first brake inhibit signal;
   (c) ramp generator means responsive to said variable wheel speed signal for generating a vehicle velocity ramp signal proportional to vehicle speed;
   (d) pulse width detector means responsive to said brake control signal for producing a retarding force signal representing road surface conditions during the period that said brake control signal varies from a brake inhibit value to a normal brake value;
   (e) automatically adjustable switching means responsive to said brake control signal, said retarding force signal and said vehicle velocity ramp signal for producing a second brake inhibit signal; and
   (f) brake controller means responsive to said first and second brake inhibit signals for generating said brake control signal.

22. A skid control module for a vehicle brake control system of the type including sensor means for generating a signal having a frequency varying in accordance with wheel speed comprising:
   (a) a frequency converter circuit coupled to said sensor means for generating a D.C. output varying in magnitude in accordance with wheel speed;
   (b) a deceleration rate detector circuit responsive to the rate of change of the output of said frequency converter circuit for generating a first brake inhibit signal when the rate of change of said frequency converter circuit output signal exceeds a preset wheel speed deceleration limit;
   (c) an acceleration rate detector circuit responsive to the rate of change of the output of said frequency converter circuit for generating a second brake inhibit signal when the rate of change of the frequency converter circuit output signal does not exceed a preset wheel speed acceleration limit;
   (d) an adjustable switching circuit responsive to the output of said frequency converter circuit for generating a brake inhibit signal when the wheel speed decreases below a value determined by vehicle speed and braking conditions;
   (e) a ramp generator circuit for generating a signal varying in accordance with vehicle speed for adjusting the switching limit of said adjustable switching circuit and for setting said switching limit less than vehicle speed below which said acceleration rate detector circuit is inhibited from operating; and
   (f) logic control means having inputs connected to said deceleration rate detector circuit, said acceleration rate detector circuit and said adjustable switching circuit, for generating a brake control output signal when all inputs thereto are at a brake inhibit level, thereby inhibiting the normal operation of the vehicle brake control system.

23. The skid control module of claim 22 and further including a retarding force detector circuit for generating a signal reflecting braking conditions for further adjusting the switching limit of said switching circuit.

24. The skid control module of claim 23 wherein the switching limit of said switching circuit is further adjusted by said brake control output signal for inhibiting the operation thereof during a brake inhibit cycle.

25. A skid control module in a vehicle brake control system comprising:
   (a) means for generating a D.C. output signal varying in magnitude in accordance with vehicle wheel speed;
   (b) wheel speed rate detector means responsive to the rate of change of the output signal of said generating means and having an output signal that varies from a normal braking level to a brake inhibit level when the rate of change of said D.C. output signal exceeds a preset wheel speed deceleration limit and returns to the normal braking level when the rate of wheel speed deceleration drops below said preset limit;
   (c) latching means for inhibiting the return of the output signal of said wheel speed rate detector means to the normal braking level from the brake inhibit level for a fixed time after the rate of wheel speed deceleration drops below said preset limit;
   (d) switching means responsive to the output signal of said generating means for producing a brake inhibit signal when the wheel speed decreases below a value determined by vehicle speed and braking conditions;
   (e) first signal generating means for generating a signal varying in accordance with vehicle speed for adjusting the switching level of said switching means and for setting the time delay interval that said latching means prevents the return of the output signal of said wheel speed rate detector means to the normal braking level; and
   (f) control means having inputs connected to said wheel speed rate detector means and said switching means, said control means generating a brake control output signal when the inputs thereto are at a brake inhibit level, thereby inhibiting the normal operation of the vehicle brake control system.

26. The skid control module of claim 25 and further including second signal generating means for generating a signal reflecting braking conditions for further adjusting the switching level of said switching means.

27. The skid control module of claim 26 and further including switch inhibit means responsive to the brake control output signal and connected to said switching means to inhibit the operation thereof during a brake inhibit cycle.

28. A skid control module for a vehicle brake control system of the type that generates a brake control signal varying in accordance with braking conditions comprising in combination:
   (a) a wheel speed sensor circuit for generating a variable A.C. output signal proportional to vehicle wheel speed;
   (b) a frequency converter coupled to said sensor circuit for converting said A.C. signal to a variable D.C. output signal varying in magnitude in accordance with vehicle wheel speed;
   (c) a deceleration rate detector responsive to the rate of change of the output of said frequency converter for generating a first brake inhibit signal when the rate of change of the frequency converter output exceeds a preset wheel speed deceleration limit;
   (d) an acceleration rate detector responsive to the rate of change of the output of said frequency converter for generating a second brake inhibit signal when the rate of change of the frequency converter output does not exceed a preset wheel speed acceleration limit;
   (e) a vehicle speed and braking condition circuit for generating signals proportional to vehicle speed and the coefficient of friction of the surface upon which said vehicle is traveling;
   (f) an adjustable switching circuit responsive to the output of said vehicle speed and braking condition circuit for generating a brake inhibit signal when the wheel speed decreases below a value determined by vehicle speed and braking conditions; and
   (g) logic control means responsive to the outputs of said deceleration rate detector, said acceleration rate detector and said adjustable switching circuit, said logic control means generating a brake control output signal when all inputs thereto are at a brake inhibit level, thereby inhibiting the normal operation of said vehicle brake control system.

29. The skid control module of claim 28 and further including an inhibit circuit for inhibiting the operation of said acceleration rate detector for wheel speeds below a preset value less than the vehicle speed.

30. A skid control module in a vehicle brake control system of the type that generates a brake control output signal varying in accordance with braking conditions comprising in combination:
   (a) signal generating means for generating a variable A.C. output signal proportional to vehicle wheel speed;
   (b) frequency converter means coupled to said signal generating means for converting said A.C. signal to a D.C. output signal varying in magnitude in accordance with vehicle wheel speed;
   (c) wheel speed rate detector means responsive to the rate of change of the output signal of said frequency converter means for generating an output signal that varies from a normal braking level to a brake inhibit level when the rate of change of said D.C. output signal exceeds a preset wheel speed deceleration limit and returns to the normal braking level when the rate of change of said D.C. output signal drops below said preset wheel speed deceleration limit;
   (d) latching means coupled to said wheel speed rate detector means for inhibiting the return of the output signal of said wheel speed rate detector means to the normal braking level from the brake inhibit level for a fixed time after the rate of wheel speed deceleration drops below said preset limit;
   (e) circuit means for generating output signals proportional to vehicle speed and braking conditions;
   (f) switching means responsive to the output signals of said circuit means for producing a brake inhibit signal when the wheel speed decreases below a value determined by vehicle speed and braking conditions; and
   (g) brake control means responsive to the output signals of said wheel speed rate detector means and said switching means for generating a brake control output signal when the inputs thereto are at a brake inhibit level, thereby inhibiting the normal operation of the vehicle brake control system.

31. The skid control module of claim 30 including means for inhibiting the operation of said latching means during a normal braking cycle.

32. A skid control module in a vehicle brake control system comprising:
   (a) means for generating an output varying in magnitude in accordance with vehicle wheel speed;
   (b) a deceleration rate detector responsive to a rate of change of the output of said generating means and having an output that changes from a normal braking level to a brake inhibit level when the rate of change of said generating means output exceeds a preset wheel speed deceleration limit and returns to the normal braking level when the rate of wheel speed deceleration drops below said preset deceleration limit;
   (c) a latch circuit for inhibiting a return of the output of said deceleration rate detector to the normal braking level from the brake inhibit level for a time interval varying with rear wheel speed acceleration and vehicle speed;
   (d) an acceleration rate detector responsive to the output of said generating means and having an output that changes from a brake inhibit level to a normal braking level when the rate of change of said generating means output exceeds a preset wheel speed acceleration limit and returns to the brake inhibit level when the rate of wheel speed acceleration drops below said preset acceleration limit;
   (e) an inhibit circuit for inhibiting the switching of the output of said acceleration rate detector to the normal braking level from the brake inhibit level for wheel speeds below a preset value less than vehicle speed;
   (f) an automatically adjustable switching circuit responsive to the output of said generating means and producing a brake inhibit signal when the wheel speed decreases below a value determined by vehicle speed and braking conditions;
   (g) a logic gate circuit having inputs coupled to said deceleration rate detector, said acceleration rate detector and said switching circuit for generating a brake inhibit signal when all inputs thereto are at a brake inhibit level; and (h) an output circuit having an input connected to said logic gate circuit, said output circuit generating a brake control output signal when the input thereto is at the brake inhibit level, thereby inhibiting the normal operation of the vehicle brake control system.

33. The skid control module of claim 32 and further including a ramp generator circuit for generating a signal varying in accordance with vehicle speed for adjusting the switching level of said switching circuit, for setting the value less than vehicle speed below which said inhibit circuit inhibits the operation of said acceleration rate detector, and presets the time interval of said latch circuit during which said deceleration rate detector is inhibited from returning to a normal braking level.

34. The skid control module of claim 33 and further including a latch inhibit circuit for inhibiting said latch circuit during the normal braking cycle.

35. The skid control module of claim 34 and further including a retarding force detector circuit for generating a signal reflecting braking conditions for further adjusting the switching level of said switching circuit.

36. The skid control module of claim 35 wherein said output circuit is coupled to said switching circuit to inhibit the operation thereof during a brake inhibit cycle.

37. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:
control circuit means for actuating the modulating valve to the one condition in response to an occurrence indicating an incipient skid condition with said control circuit means responsive to a different occurrence for actuating the valve to the other condition, said control circuit means comprising
first velocity means for providing a first velocity signal representative of the velocity of the vehicle, and
second velocity means for providing a second velocity signal representative of velocity of the wheel, and
first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal, and
second means responsive to said first and second velocity means for providing a second control signal preventing actuation of the valve to the other condition until said second velocity signal attains a fourth determinable magnitude indicative of a wheel speed less than the vehicle speed with said fourth determinable magnitude varying with said first velocity signal, with
said second means providing said second control signal with said fourth determinable magnitude being varied such that said second velocity signal attains said fourth determinable magnitude at a generally fixed increment from said first velocity signal.

38. The system of claim 37 with said different occurrence being an acceleration of the wheel of a third determinable magnitude.

39. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:
control circuit means for actuating the modulating valve to the one condition in response to an occurrence indicating an incipient skid condition with said control circuit means actuating the modulating valve to the other condition in response to a wheel acceleration of third determinable magnitude, and
first means responsive to indications of the velocity of the wheel for preventing actuations of the modulating valve to the one condition for wheel speeds above a first determinable magnitude and responsive to an indication of the $\mu$ of the surface for decreasing said first determinable magnitude for higher $\mu$ surfaces, with
the indication of the $\mu$ of the surface being derived as a function of the time elapsed between actuation of the valve to the one condition and to the other condition, and with
said control circuit means including charge storage means with the magnitude of charge varying with the magnitude of said elapsed time.

40. The system of claim 39 with said control circuit means including discharge means for rapidly discharging said storage means after actuation of the valve to the one condition whereby the magnitude of charge can be reset to provide a new indication of $\mu$ of the surface for each cycle.

41. The system of claim 40 with said control circuit means including charge means actuatable prior to the first actuation of the valve to the one condition for providing an initial charge on said storage means indicative of a medium $\mu$ surface.

42. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:
control circuit means for actuating the modulating valve to the one condition in response to an occurrence indicating an incipient skid condition and actuating the modulating valve to the other condition in response to a different occurrence indicating termination of the skid condition and
first means responsive to indications of the velocity of the wheel for preventing actuation of the modulating valve to the other condition for wheel speeds below a first determinable magnitude.

43. The system of claim 42 with said first means responsive to indications of the velocity of the vehicle with said first determinable magnitude being generally a fixed increment less than the velocity of the vehicle.

44. The system of claim 43 with said occurrence being a deceleration of the wheel of a determinable magnitude and with said different occurrence being an acceleration of the wheel of a different determinable magnitude.

45. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:

control circuit means for actuating the modulating valve to the one condition in response to an occurrence indicating an incipient skid condition, said control circuit means comprising first velocity means for providing a first velocity signal representative of velocity of the vehicle and second velocity means for providing a second velocity signal representative of velocity of the wheel, and first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal so as to be varied in accordance with the elapsed time that the valve is in the one condition, and with said control circuit actuating the valve to the other condition in response to an acceleration of the wheel of a third determinable magnitude.

46. The system of claim 45 with said first determinable magnitude being varied in accordance with said elapsed time such that said second velocity signal attains said first determinable magnitude at higher wheel speeds as said elapsed time is longer.

47. The system of claim 46 with said occurrence being a deceleration of a second determinable magnitude.

48. The system of claim 47 with said control circuit means actuating the modulating valve to its other condition in response to a selected magnitude of a characteristic of said second determinable magnitude, said first velocity means increasing said selected magnitude in response to magnitudes of said second velocity signal representative of higher vehicle velocities.

49. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:

control circuit means for actuating the modulating valve to the one condition in response to an occurrence indicating an incipient skid condition with said control circuit means responsive to a different occurrence for actuating the valve to the other condition with said different occurrence being an acceleration of the wheel of a third determinable magnitude, said control circuit means comprising first velocity means for providing a first velocity signal representative of velocity of the vehicle, and second velocity means for providing a second velocity signal representative of velocity of the wheel, and first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal with said first means providing said first control signal with said first determinable magnitude being varied such that said second velocity signal attains said first determinable magnitude at higher wheel speeds when said first velocity signal provides an indication of higher vehicle speeds, and second means responsive to said first and second velocity means for providing a second control signal preventing actuation of the valve to the other condition until said second velocity signal attains a fourth determinable magnitude indicative of a wheel speed less than the vehicle speed with said fourth determinable magnitude varying with said first velocity signal, with said second means providing said second control signal with said fourth determinable magnitude being varied such that said second velocity signal attains said fourth determinable magnitude at a generally fixed increment from said first velocity signal, with said occurrence being a deceleration of a second determinable magnitude, said control circuit means actuating the modulating valve to its other condition in response to a selected magnitude of a characteristic of said second determinable magnitude, said first velocity means increasing said selected magnitude in response to magnitudes of said second velocity signal representative of higher vehicle velocities, said control circuit actuating the valve to the other condition in response to an acceleration of the wheel of a third determinable magnitude, said first determinable magnitude being varied in accordance with the elapsed time that the valve is in the one condition, said first determinable magnitude being varied in accordance with said elapsed time such that said second velocity signal attains said first determinable magnitude at higher wheel speeds as said elapsed time is longer.

50. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising:

control circuit means for actuating the modulating valve to the one condition in response to an occurrence indicating an incipient skid condition and first means responsive to indication of the velocity of the wheel and of the vehicle for preventing actuation of the modulating valve to the one condition for wheel speeds above a first determinable magnitude with said first determinable magnitude being higher for higher vehicle velocities whereby excessive wheel departure is inhibited, with said first means responsive to an indication of the $\mu$ of the surface for decreasing said first determinable magnitude for higher $\mu$ surfaces.

51. The system of claim 50 with said control circuit means actuating the modulating valve to the other condition in response to a wheel acceleration of a third determinable magnitude and with the indication of the $\mu$ of the surface being derived as a function of the time elapsed between actuation of the valve to the one condition and to the other condition.

52. The system of claim 50 with said occurrence being deceleration of the wheel of a second determinable magnitude.

53. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising: control circuit means for actuating the modulating valve to the one condition in response to an occurrence indicating an incipient skid condition, and first means responsive to indications of the velocity of the wheel for preventing actuations of the modulating valve to the one condition for wheel speeds above a first determinable magnitude and responsive to an indication of the $\mu$ of the surface for decreasing said first determinable magnitude for higher $\mu$ surfaces.

54. The system of claim 53 with said control circuit means actuating the modulating valve to the other condition in response to a wheel acceleration of third determinable magnitude and with the indication of the $\mu$ of the surface being derived as a function of the time elapsed between actuation of the valve to the one condition and to the other condition.

55. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising: control circuit means for actuating the modulating valve to the one condition in response to an occurrence indicating an incipient skid condition, said control circuit means comprising first velocity means for providing a first velocity signal representative of the velocity of the vehicle and second velocity means for providing a second velocity signal representative of velocity of the wheel, and first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal, said first means providing said first control signal with said first determinable magnitude being varied such that said second velocity signal attains said first determinable magnitude at higher wheel speeds when said first velocity signal provides an indication of higher vehicle speeds, and said occurrence being a deceleration of a second determinable magnitude.

56. The system of claim 55 with said control circuit means actuating the modulating valve to its other condition in response to a selected magnitude of a characteristic of said second determinable magnitude, said first velocity means increasing said selected magnitude in response to magnitudes of said second velocity signal representative of higher vehicle velocities.

57. In a skid control system for controlling fluid-pressure-actuated brakes of at least one wheel of a wheeled vehicle by controlling the fluid pressure to the brakes by a modulating valve actuated to one condition for relieving the fluid pressure and to another condition for applying the fluid pressure, the invention comprising: control circuit means for actuating the modulating valve to the one condition in response to an occurrence indicating an incipient skid condition, said control circuit means comprising first velocity means for providing a first velocity signal representative of the velocity of the vehicle and second velocity means for providing a second velocity signal representative of velocity of the wheel, and first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal and said control circuit means actuating the valve to the other condition in response to an acceleration of the wheel of a third determinable magnitude.

58. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising: control circuit means for actuating the modulating valve to the one condition in response to an occurrence indicating an incipient skid condition, said control circuit means comprising first velocity means for providing a first velocity signal representative of the velocity of the vehicle and second velocity means for providing a second velocity signal representative of velocity of the wheel, and first means responsive to said first and second velocity signals for providing a first control signal and including means responsive to said first control signal for preventing actuation of the valve to the one condition until said second velocity signal attains a selected first determinable magnitude indicative of a wheel speed less than vehicle speed with said first determinable magnitude varying with said first velocity signal, said control circuit means responsive to a different occurrence for actuating the valve to the other condition and second means responsive to said first and second velocity means for providing a second control signal preventing actuation of the valve to the other condition until said second velocity signal attains a fourth determinable magnitude indicative of a wheel speed less than the vehicle speed with said fourth determinable magnitude varying with said first velocity signal.

59. The system of claim 58 with said second means providing said second control signal with said fourth determinable magnitude being varied such that said second velocity signal attains said fourth determinable magnitude at a generally fixed increment from said first velocity signal, with said different occurrence being an acceleration of the wheel of a third determinable magnitude, and with said first means providing said first control signal with said first determinable magnitude being varied such that said second velocity signal attains said first determinable magnitude at higher wheel speeds when said first velocity signal provides an indication of higher vehicle speeds.

60. In a skid control system for controlling fluid-pressure-actuated brakes of at least one wheel of a wheeled vehicle by controlling the fluid pressure to the brakes via a modulating valve actuated to one condition for relieving the fluid pressure and to another condition for applying the fluid pressure, the invention comprising: control circuit means for actuating the modulating valve to the one condition in response to an occurrence indicating an incipient skid condition and first means responsive to indication of the velocity of the wheel and of the vehicle for preventing actuation of the modulating valve to the one condition for wheel speeds above a first determinable magnitude with said first determinable magnitude being higher for higher vehicle velocities whereby excessive wheel departure is inhibited.

61. In a skid control system for controlling fluid pressure actuated brakes of at least one wheel of a wheeled vehicle by controlling the fluid pressures to the brakes via a modulating valve actuated to one condition for relieving the fluid pressure and to another condition for applying the fluid pressure, the invention comprising: control circuit means for actuating the modulating valve in response to predetermined occurrences including an indication of vehicle velocity, first means providing said indication as a magnitude of vehicle velocity as a function of the magnitude of elapsed time of the valve being in the one condition.

62. The system of claim 61 with said first means comprising storage means and comprising second means for initially providing a charge to said storage means indicative of the speed of the wheel and for preventing discharging of said storage means during said elapsed time.

63. The system of claim 62 with said second means discharging said storage means at a rate exceeding the deceleration rate of the vehicle and generally maintaining the charge on said storage means when the valve is in the one condition.

64. The system of claim 63 with said control circuit means responsive to an indication of the $\mu$ of the surface for providing a decrease in said elapsed time with an increase in $\mu$.

65. The system of claim 64 with said control circuit means including second means for controlling actuation of the valve to the other condition as a function of wheel spin-up.

* * * * *